(12) United States Patent
Song et al.

(10) Patent No.: US 10,602,631 B2
(45) Date of Patent: Mar. 24, 2020

(54) COVER PLATE AND FOLDABLE DISPLAY DEVICE INCLUDING THE SAME

(71) Applicant: LG Display Co., Ltd., Seoul (KR)

(72) Inventors: Kelly Soo Yeun Song, Paju-si (KR); Nam Ki, Seoul (KR); Gyu-Ho Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 176 days.

(21) Appl. No.: 15/816,630

(22) Filed: Nov. 17, 2017

(65) Prior Publication Data

US 2018/0153049 A1 May 31, 2018

(30) Foreign Application Priority Data

Nov. 30, 2016 (KR) .................. 10-2016-0162200

(51) Int. Cl.
| | | |
|---|---|---|
| *H05K 5/03* | (2006.01) | |
| *G06F 1/16* | (2006.01) | |
| *H04M 1/02* | (2006.01) | |
| *B32B 3/16* | (2006.01) | |
| *B32B 7/12* | (2006.01) | |
| *B32B 27/08* | (2006.01) | |
| *H05K 5/00* | (2006.01) | |
| *G02F 1/1333* | (2006.01) | |
| *G02F 1/1368* | (2006.01) | |
| *H01L 27/32* | (2006.01) | |
| *H01L 51/52* | (2006.01) | |

(52) U.S. Cl.
CPC ................ *H05K 5/03* (2013.01); *B32B 3/16* (2013.01); *B32B 7/12* (2013.01); *B32B 27/08* (2013.01); *G06F 1/1601* (2013.01); *G06F 1/1652* (2013.01); *H04M 1/0214* (2013.01); *H04M 1/0268* (2013.01); *H05K 5/0017* (2013.01); *B32B 2457/20* (2013.01); *G02F 1/1368* (2013.01); *G02F 1/133305* (2013.01); *G02F 1/133308* (2013.01); *G02F 2001/133314* (2013.01); *G02F 2001/133331* (2013.01); *H01L 27/3244* (2013.01); *H01L 51/5237* (2013.01); *H01L 2251/5338* (2013.01); *Y10T 428/1059* (2015.01); *Y10T 428/1086* (2015.01)

(58) Field of Classification Search
CPC .... H05K 5/03; H04M 1/0268; H04M 1/0214; H01L 2251/5338; B32B 7/12; B32B 27/08; B32B 3/16; B32B 2457/20; G06F 1/1652; G06F 1/1601; G02F 1/133308; G02F 1/133305; G02F 2001/133331; Y10T 428/1086; Y10T 428/1059; Y10T 428/1036
USPC ......... 428/1.1, 1.3, 1.5, 1.6, 12; 349/16, 158
See application file for complete search history.

(56) References Cited

U.S. PATENT DOCUMENTS

| | | |
|---|---|---|
| 2015/0043174 A1 | 2/2015 | Han et al. |
| 2016/0104850 A1 | 4/2016 | Joo et al. |

FOREIGN PATENT DOCUMENTS

| | | |
|---|---|---|
| CN | 104347000 A | 2/2015 |
| CN | 105514115 A | 4/2016 |
| JP | 10-96274 A | 4/1998 |

*Primary Examiner* — Ruiyun Zhang
(74) *Attorney, Agent, or Firm* — Birch, Stewart, Kolasch & Birch, LLP

(57) ABSTRACT

An embodiment of the present invention provides a cover plate including a high stiffness base and a plurality of low stiffness patterns arranged in a hole or an indentation of the high stiffness base. The cover plate and a foldable display device including the cover plate can be foldable in various directions.

9 Claims, 10 Drawing Sheets

<u>1</u>

30

10

20

COVER PLATE AND FOLDABLE DISPLAY DEVICE INCLUDING THE SAME

CROSS-REFERENCE TO RELATED APPLICATION

The present application claims the priority benefit of Korean Patent Application No. 10-2016-0162200 filed in the Republic of Korea on Nov. 30, 2016, which is hereby incorporated by reference into the present application.

BACKGROUND OF THE INVENTION

Field of the Invention

The present invention relates to a display device and more particularly to a cover plate being foldable in various directions and a foldable display device including the cover plate.

Discussion of the Related Art

As information technology and mobile communication technology have been developed, a display device being capable of displaying a visual image has also been developed. Flat panel display devices, such as a liquid crystal display (LCD) device and an organic light emitting display (OLED) device, are developed and used.

In general, an LCD device includes a liquid crystal panel, which includes upper and lower substrates and a liquid crystal layer therebetween. The liquid crystal layer is driven by an electric field induced between a pixel electrode and a common electrode to display images.

An OLED device includes an organic emitting diode which includes an anode, a cathode and an organic emitting layer therebetween. In the organic emitting diode, holes and electrodes respectively from the anode and the cathode are combined such that light is emitted from the organic emitting layer to display images.

Recently, a foldable display device, which is fabricated by using a flexible substrate, is in demand. The foldable display device may be folded to be portable and may be unfolded to display images. Namely, with the foldable display device, a large-sized image display can be provided, and portability of the display device is improved.

FIG. 1 is a schematic cross-sectional view of a foldable display device 1 according to the related art.

As shown in FIG. 1, the foldable display device 1 includes a display panel 10, a backplate 20 and a cover window 30.

When the display panel 10 is a light emitting diode panel, the display panel 10 may include a flexible substrate, a light emitting diode on the flexible substrate and a thin film transistor (TFT) for driving the light emitting diode.

For example, the organic emitting diode may include an anode, which is connected to the TFT, an organic emitting layer on the anode, and a cathode on the organic emitting layer. In addition, an encapsulation film for preventing moisture penetration may cover the light emitting diode.

On the other hand, when the display panel 10 is a liquid crystal panel, the display panel 10 may include a TFT on the flexible substrate, a pixel electrode, which is connected to the TFT, a counter substrate, which faces the flexible substrate, a common electrode, which is on the flexible substrate or the counter substrate, and a liquid crystal layer between the flexible substrate and the counter substrate. The display panel 10 may further include a backlight unit.

With a carrier substrate (not shown) attached to a lower surface of the flexible substrate, elements such as the TFT are formed on the flexible substrate, and the carrier substrate is released to obtain the flexible display panel 10.

In the flexible display panel 10, since the flexible substrate is thin, the backplate 20 for supporting the display panel 10 is disposed under the display panel 10. The backplate 20 may be attached to the display panel 10 by an adhesive layer.

The cover window 30 is attached to an upper side of the display panel 10. The damage on the display panel 10 from outer impacts is prevented by the cover window 30. Although not shown, the cover window 30 may be attached to the display panel 10 by an adhesive layer. For example, the cover window 30 may be formed of a tempered glass or high-hardness plastic.

In the related art foldable display device, when the folding and unfolding operation is repeated in the foldable display device 1, damages, e.g., cracks, may be generated in the cover window 30 such that the display quality and reliability (durability) of the cover window 30 and the foldable display device 1 are decreased. The damages may be generated in the backplate 20.

SUMMARY OF THE INVENTION

Accordingly, the present invention is directed to a cover plate and a foldable display device including the same that substantially obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a cover plate includes a plurality of low stiffness patterns being spaced apart from each other; and a high stiffness base filling a space between the plurality of low stiffness patterns and providing a flat surface with the plurality of low stiffness patterns.

In another aspect, a cover plate includes a high stiffness base including a plurality of upper indentations at a first surface and a plurality of lower indentations corresponding to the plurality of upper indentations at a second surface; a plurality of first low stiffness patterns in the upper indentations and provide a flat surface with the first surface; and a plurality of second low stiffness patterns in the lower indentations.

In another aspect, a cover plate includes a first portion having a first stiffness; and a second portion having a second stiffness different from the first stiffness, wherein the first portion and the second portion are alternately arranged along a first direction and along a second direction being perpendicular to the first direction.

In another aspect, a foldable display device includes a cover plate which includes a plurality of low stiffness patterns being spaced apart from each other, and a high stiffness base filling a space between the plurality of low stiffness patterns and providing a flat surface with the plurality of low stiffness patterns. The foldable display device further includes a display panel at a side of the cover plate.

In another aspect, a foldable display device includes a cover plate which includes a high stiffness base including a plurality of upper indentations at a first surface and a plurality of lower indentations corresponding to the plurality of upper indentations at a second surface, a plurality of first low stiffness patterns in the upper indentations and provide a flat surface with the first surface, and a plurality of second low stiffness patterns in the lower indentations. The foldable display device further includes a display panel at a side of the cover plate.

In another aspect, a foldable display device includes a cover plate which includes a first portion having a first stiffness, and a second portion having a second stiffness different from the first stiffness. The foldable display device further includes a display panel at a side of the cover plate, wherein the first portion and the second portion are alternately arranged along a first direction and along a second direction being perpendicular to the first direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to the preferred embodiments, examples of which are illustrated in the accompanying drawings. All the components in each of various foldable display devices and various cover plates usable in each of the foldable display devices according to all embodiments of the present invention are operatively coupled and configured.

Figure 1:
FIG. 1 is a schematic cross-section view of the related art foldable display device.
Figure 1:
Figure 1:
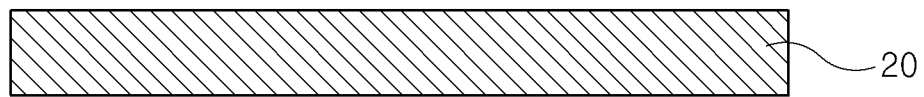
Figure 2:
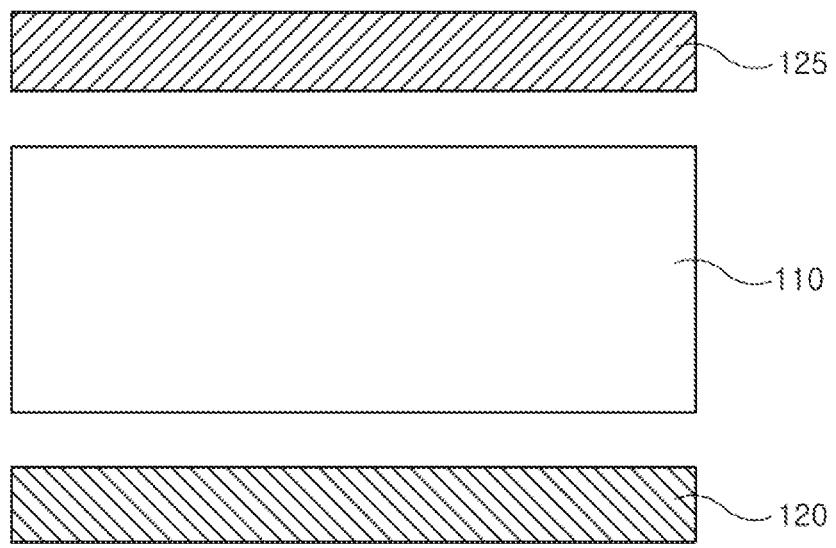
FIG. 2 is a schematic cross-sectional view of a foldable display device according to an embodiment of the present invention.

FIG. 2 is a schematic cross-sectional view of a foldable display device according to an embodiment of the present invention.

As shown in FIG. 2, a foldable display device 100 according to the present invention includes a display panel 110, a backplate 120 and a cover window 125.

The foldable display device of the present invention can be folded, bent or rolled along at least one direction. The foldable display device of the present invention can be referred to as a bendable display device, a rollable display device or a flexible display device.

In the foldable display device 100, the backplate 120 is disposed under and covers a rear side of the display panel 110. The display panel 110 is protected and supported by the backplate 120. The cover window 125 is disposed on and covers a front side, i.e., a display side, of the display panel 110. The front side of the display panel 110 is protected by the cover window 125.

Further, a touch panel may be positioned between the display panel 110 and the cover window 125.

The display panel 110 may be a liquid crystal panel or a light emitting diode panel. For example, the display panel 110 may be a liquid crystal panel as shown in FIG. 3A, or may be the light emitting diode panel as shown in FIG. 3B, and includes a plurality of pixels (pixel regions) for displaying images.

Figure 3A:
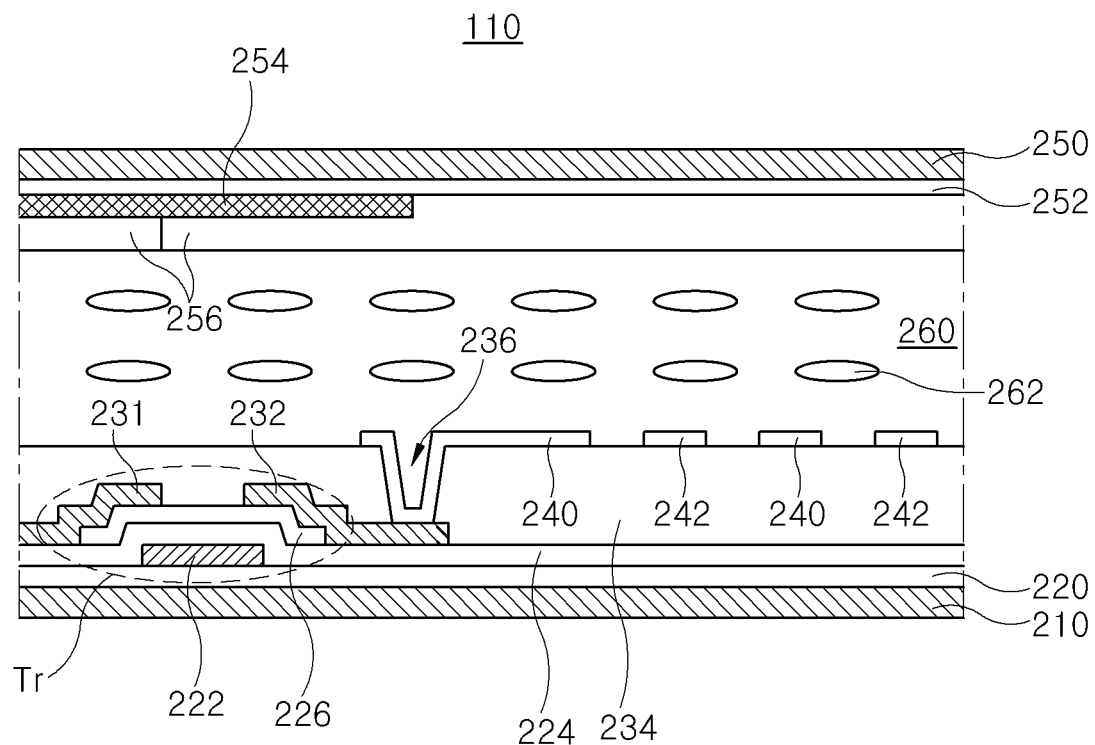
FIGS. 3A and 3B are schematic cross-sectional views of display panels for a foldable display device according to embodiments of the present invention.
Figure 3B:
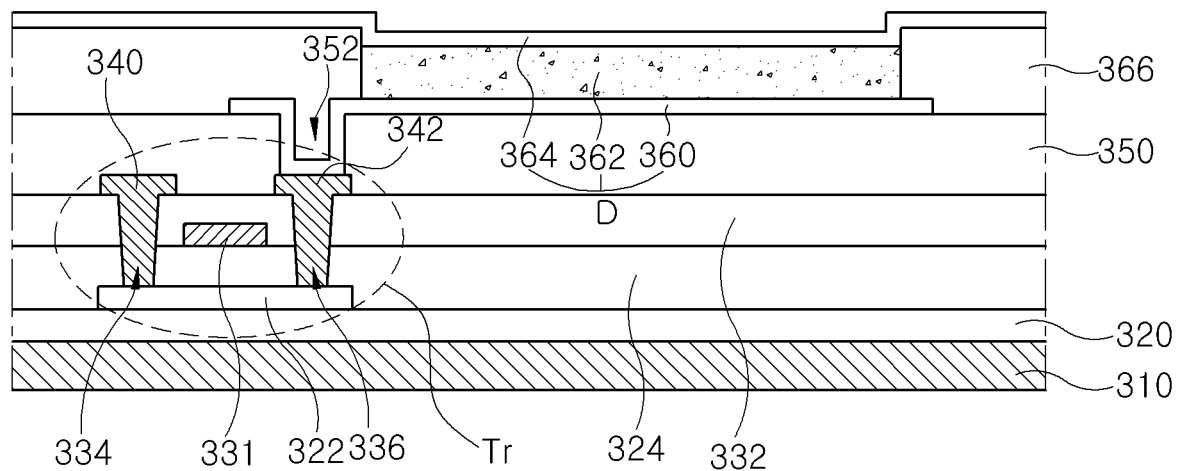

Referring to FIG. 3A, which is a schematic cross-section view of a liquid crystal panel, the display panel 110 includes first and second substrates 210 and 250, which face each other, and a liquid crystal layer 260, which includes liquid crystal molecules 262, therebetween.

Each of the first and second substrates 210 and 250 may be a flexible plastic substrate. For example, each of the first and second substrates 210 and 250 may be a polyimide substrate.

A first buffer layer 220 is formed on the first substrate 210, and a TFT Tr is formed on the first buffer layer 220. The first buffer layer 220 may be omitted.

A gate electrode 222 is formed on the first buffer layer 220, and a gate insulating layer 224 is formed on the gate electrode 222. In addition, a gate line, which is connected to the gate electrode 222, is formed on the first buffer layer 220. The gate insulating layer 224 may be formed of an inorganic insulating material such as silicon oxide or silicon nitride.

A semiconductor layer 226, which corresponds to the gate electrode 222, is formed on the gate insulating layer 224. The semiconductor layer 226 may include an oxide semiconductor material. Alternatively, the semiconductor layer may include an active layer of intrinsic amorphous silicon and an ohmic contact layer of impurity-doped amorphous silicon.

A source electrode 231 and a drain electrode 232, which are spaced apart from each other, are formed on the semiconductor layer 226. In addition, a data line, which is electrically connected to the source electrode 231 and crosses the gate line to define a pixel region among a plurality of pixel regions, is formed.

The gate electrode 222, the semiconductor layer 226, the source electrode 231 and the drain electrode 232 constitute the TFT Tr.

A passivation layer 234, which includes a drain contact hole 236 exposing the drain electrode 232, is formed on the TFT Tr.

A pixel electrode 240, which is connected to the drain electrode 232 through the drain contact hole 236, and a common electrode 242, which is alternately arranged with the pixel electrode 240, are formed on the passivation layer 234.

A second buffer layer 252 is formed on the second substrate 250, and a black matrix 254, which shields a non-display region such as the TFT Tr, the gate line and the data line, is formed on the second buffer layer 252. In addition, a color filter layer 256, which corresponds to the pixel region, is formed on the second buffer layer 252. The second buffer layer 252 and the black matrix 254 may be omitted.

The first and second substrates 210 and 250 are attached with the liquid crystal layer 260 therebetween. The liquid crystal molecules 262 of the liquid crystal layer 260 is driven by an electric field between the pixel and common electrode 240 and 242.

First and second alignment layers may be formed over the first and second substrates 210 and 250 to be adjacent to the liquid crystal layer 260. In addition, first and second polarization plates, which have perpendicular transmission axes, may be attached to an outer side of each of the first and second substrates 210 and 250. Moreover, a flexible backlight unit may be disposed under the first substrate 210 to provide light.

For example, the backlight unit may include a light guide plate under the display panel 110, a light source at a side of the light guide plate, a reflective sheet under the light guide plate and an optical sheet between the light guide plate and the display panel 110.

On the other hand, referring to FIG. 3B, which is a schematic cross-section view of a light emitting diode panel, the display panel 110 includes a substrate 310, a TFT Tr on or over the substrate 310 and a light emitting diode D disposed over the substrate 310 and connected to the TFT Tr.

The substrate 310 may be a flexible plastic substrate. For example, the substrates 310 may be a polyimide substrate.

A buffer layer 320 is formed on the substrate 310, and a thin film transistor (TFT) Tr is formed on the buffer layer 320. The buffer layer 320 may be omitted.

A semiconductor layer 322 is formed on the buffer layer 320. The semiconductor layer 322 may include an oxide semiconductor material or polycrystalline silicon.

When the semiconductor layer 322 includes the oxide semiconductor material, a light-shielding pattern may be formed under the semiconductor layer 322. The light to the semiconductor layer 322 is shielded or blocked by the light-shielding pattern such that thermal degradation of the semiconductor layer 322 can be reduced or prevented. On the other hand, when the semiconductor layer 322 includes polycrystalline silicon, impurities may be doped into both sides of the semiconductor layer 322.

A gate insulating layer 324 is formed on the semiconductor layer 322. The gate insulating layer 324 may be formed of an inorganic insulating material such as silicon oxide or silicon nitride.

A gate electrode 331, which is formed of a conductive material, e.g., metal, is formed on the gate insulating layer 324 to correspond to a center of the semiconductor layer 322.

In FIG. 3B, the gate insulating layer 324 is formed on the entire surface of the substrate 310. Alternatively, the gate insulating layer 324 may be patterned to have the same shape as the gate electrode 331.

An interlayer insulating layer 332, which is formed of an insulating material, is formed on an entire surface of the substrate 310 including the gate electrode 331. The interlayer insulating layer 332 may be formed of an inorganic insulating material, e.g., silicon oxide or silicon nitride, or an organic insulating material, e.g., benzocyclobutene or photo-acryl.

The interlayer insulating layer 332 includes first and second contact holes 334 and 336 exposing both sides of the semiconductor layer 322. The first and second contact holes 334 and 336 are positioned at both sides of the gate electrode 331 to be spaced apart from the gate electrode 331.

In FIG. 3B, the first and second contact holes 334 and 336 extend into the gate insulating layer 324. Alternatively, when the gate insulating layer 324 is patterned to have the same shape as the gate electrode 331, there may be no first and second contact holes 334 and 336 in the gate insulating layer 324.

A source electrode 340 and a drain electrode 342, which are formed of a conductive material, e.g., metal, are formed on the interlayer insulating layer 332. The source electrode 340 and the drain electrode 342 are spaced apart from each other with respect to the gate electrode 331 and respectively contact both sides of the semiconductor layer 322 through the first and second contact holes 334 and 336.

The semiconductor layer 322, the gate electrode 331, the source electrode 340 and the drain electrode 342 constitute the TFT Tr, and the TFT Tr serves as a driving element.

In FIG. 3B, the gate electrode 331, the source electrode 340 and the drain electrode 342 are positioned over the semiconductor layer 322. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

A gate line and a data line are disposed on or over the substrate 310 and cross each other to define a pixel region among a plurality of pixel regions. In addition, a switching element, which is electrically connected to the gate line and the data line, may be disposed on the substrate 310. The switching element is electrically connected to the TFT Tr as the driving element.

In addition, a power line, which is parallel to and spaced apart from the gate line or the data line, may be formed on or over the substrate 310. Moreover, a storage capacitor for maintaining a voltage of the gate electrode 331 of the TFT Tr during one frame, may be further formed on the substrate 310.

A passivation layer 350, which includes a drain contact hole 352 exposing the drain electrode 342 of the TFT Tr, is formed to cover the TFT Tr.

A first electrode 360, which is connected to the drain electrode 342 of the TFT Tr through the drain contact hole 352, is separately formed in each pixel region. The first electrode 360 may be an anode and may be formed of a conductive material having a relatively high work function. For example, the first electrode 360 may be formed of a transparent conductive material such as indium-tin-oxide (ITO) or indium-zinc-oxide (IZO).

When the display panel 310 is operated in a top-emission type, a reflection electrode or a reflection layer may be formed under the first electrode 360. For example, the reflection electrode or the reflection layer may be formed of aluminum-paladium-copper (APC) alloy.

A bank layer 366, which covers edges of the first electrode 360, is formed on the passivation layer 350. A center of the first electrode 360 in the pixel region is exposed through an opening of the bank layer 366.

An emitting layer 362 is formed on the first electrode 360. The emitting layer 362 may have a single-layered structure of an emitting material layer formed of an emitting material. Alternatively, to improve emitting efficiency, the emitting layer 362 may have a multi-layered structure including a hole injection layer, a hole transporting layer, the emitting material layer, an electron transporting layer and an electron injection layer sequentially stacked on the first electrode 360.

The emitting material layer may include an inorganic emitting material, e.g., a quantum dot, or an organic emitting material.

A second electrode 364 is formed over the substrate 310 including the emitting layer 362. The second electrode 364 is positioned at an entire surface of the display area. The second electrode 364 may be a cathode and may be formed of a conductive material having a relatively low work function. For example, the second electrode 364 may be formed of aluminum (Al), magnesium (Mg) or Al—Mg alloy.

The first electrode 360, the organic emitting layer 362 and the second electrode 364 constitute the light emitting diode D.

Further, an encapsulation film is formed on the light emitting diode D to prevent penetration of moisture into the light emitting diode D. The encapsulation film may have has a triple-layered structure of a first inorganic layer, an organic layer and a second inorganic layer. However, it is not limited thereto and other variations are possible.

A polarization plate may be disposed on the encapsulation film to reduce an ambient light reflection. The polarization plate may be a circular polarization film.

Referring again to FIG. 2, the backplate 120 may have a plate shape and cover the rear side of the display panel 110. Alternatively, the backplate 120 may include a horizontal surface and side surfaces to cover the rear side and lateral sides of the display panel 110.

Further, an adhesive layer may be formed between the backplate 120 and the display panel 110.

A cover plate of the present invention is used for at least one of the backplate 120 and the cover window 125.

Figure 4:
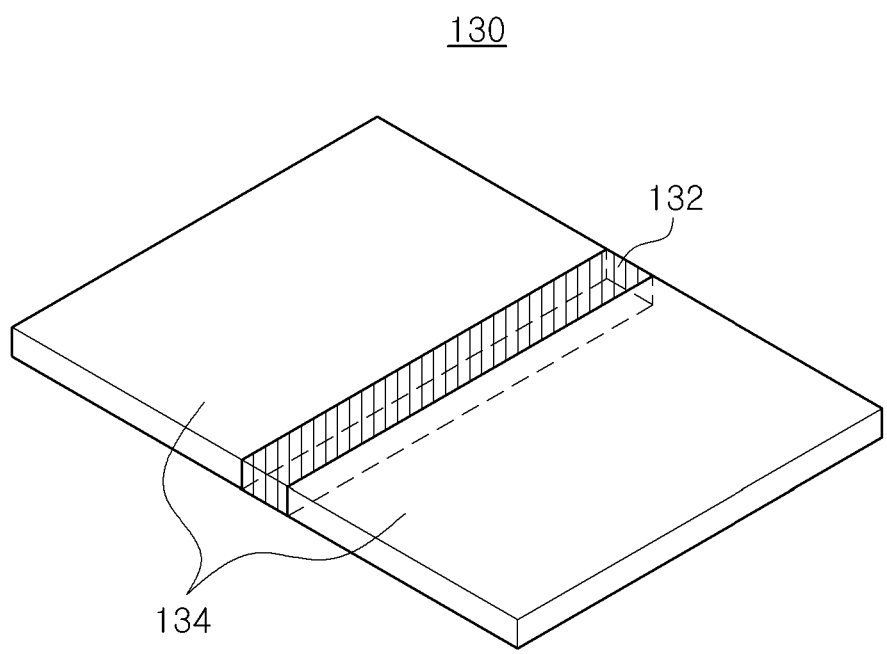
FIG. 4 is a schematic view of a cover plate according to a first embodiment of the present invention.

Referring to FIG. 4, which is a schematic view of a cover plate according to a first embodiment of the present invention, the cover plate 130 includes a first region 132 of a low stiffness (hardness) material and a second region 134 of a high stiffness material at both sides of the first region 132.

The foldable display device 100 is configured to be folded with respect to the first region 132. Namely, the cover plate 130 of the first embodiment of the present invention includes the first region 132 of the low stiffness material in correspondence to a folding region of the foldable display device 100.

Since the display panel should be protected by the cover plate, the cover plate should be formed of a high stiffness material. However, an entire of the cover plate for the foldable display device is formed of the high stiffness material, there are damages on the cover plate by the stress during the folding and/or unfolding operation.

In the cover plate 130, the first region 132 corresponding to the folding region is formed of the low stiffness material, while the second region corresponding to the unfolding region is formed of the high stiffness material. Accordingly, the damages resulting from the stress during the folding and/or unfolding operation is prevented or decreased due to the first region 132 of the low stiffness material, and the display panel 110 is sufficiently protected by the second region 134 of the high stiffness material.

On the other hand, there is a limitation of a folding direction in the foldable display device 100 including the cover plate 130 according to the first embodiment of the present invention. Namely, the cover plate 130 can be folded along one direction with respect to the first region 132 for the second regions 134 to be faced. If the cover plate 130 is folded in other direction, e.g., when the cover plate 130 is folded for both ends of the first region 132 to be closer, the cover plate 130 is folded with respect to the second region 134 such that the cover plate 130 is damaged.

Figure 5:
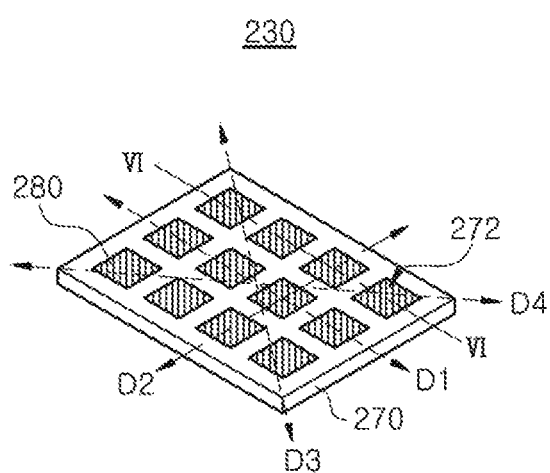
FIG. 5 is a schematic view of a cover plate according to a second embodiment of the present invention.
Figure 6:
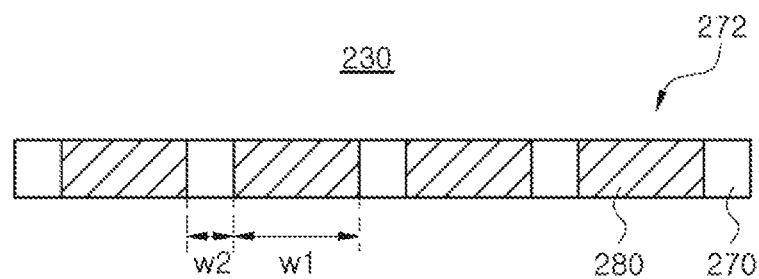
FIG. 6 is a cross-sectional view taken along the line VI-VI in FIG. 5.

FIG. 5 is a schematic view of a cover plate according to a second embodiment of the present invention, and FIG. 6 is a cross-sectional view taken along the line VI-VI in FIG. 5.

As shown in FIGS. 5 and 6, a cover plate 230 according to the second embodiment of the present invention includes a plurality of low stiffness patterns 280 arranged in a high stiffness base 270.

The low stiffness pattern 280 is formed of a material having a stiffness (modulus value or hardness) being smaller than a material of the high stiffness base 270. For example, the high stiffness base 270 may be formed of polymethylmethacrylate (PMMA)-based polymer or silicon-based polymer, and the low stiffness pattern 280 may be formed of polybutylacrylate (PBA)-based polymer or polyvinylidene fluoride (PVDF)-based polymer.

The plurality of low stiffness patterns 280 are arranged to be spaced apart from each other, and the high stiffness base 270 fills a space between low stiffness patterns 280. The low stiffness patterns 280 and the high stiffness base 270 may provide a flat surface.

In other words, the high stiffness base 270 includes a plurality of holes 272, and the low stiffness patterns 280 are positioned in the holes 272.

The low stiffness pattern 280 may have a square shape of a first width w1, and a space between adjacent low stiffness patterns 280 may have a second width w2. Namely, a portion of the high stiffness base 270 between adjacent low stiffness patterns 280 may have the second width w2. In this instance, the first width w1 may be equal to or greater than the second width w2. To minimize the damages on the high stiffness base 270 by the folding operation, the first width w1 may be greater than the second width w2. For example, the first width w1 may be about 1.3~2.5 times of the second width w2.

When the first width w1 is too larger, there is a problem in the stiffness (hardness) of the cover plate 230, and the total stiffness of the cover plate 230 is decreased such that there may be a limitation in the application of the cover plate 230 to the display device. On the other hand, when the second width w2 is too larger, there may be damages, e.g., cracks, on the cover plate 230 in the folding operation.

In addition, in the diagonal direction of the cover plate 230, the width of the low stiffness pattern 280 may be greater than the width of a portion of the high stiffness base 270 between adjacent low stiffness patterns 280.

The plurality of low stiffness patterns 280 are arranged in a lattice shape. In other words, the plurality of holes 272 in the high stiffness base 270 are arranged in the lattice shape.

The cover plate 230 is configured to be folded along various directions. Namely, in the cover plate 230, a folding region may be defined along a first direction D1 or a second direction D2 being perpendicular to the first direction D1. In addition, the folding region may be defined along a third direction D3 crossing the first and second directions D1 and D2 or a fourth direction D4 crossing the first to third directions D1 to D3.

In the cover plate 230 according to the second embodiment of the present invention, since the low stiffness patterns 280 are arranged in the holes 272 of the high stiffness base 270, a high stiffness portion and a low stiffness portion are alternately arranged with each other in all of the first to fourth directions D1 to D4. Accordingly, the foldable display device including the cover plate 230 can be folded along various directions, e.g., the first to fourth directions D1 to D4.

In other words, in the cover plate 230, a first portion having a first stiffness and a second portion having a second stiffness, which is different from the first stiffness, are alternately arranged along the first direction D1 and the second direction D2 being perpendicular to the first direction D1. In addition, along the third direction D3, which crosses the first and second directions D1 and D2, and the fourth direction D4, which crosses the first to third directions D1 to D3, the first portion and the second portion are alternately arranged.

The low stiffness patterns 280 and the high stiffness base 270 provide a flat surface and have substantially the same refractive index. Accordingly, in the foldable display device including the cover plate 230, a problem of viewing a boundary between the low stiffness patterns 280 and the high stiffness base 270 is minimized, and the display quality is improved.

Figure 7A:
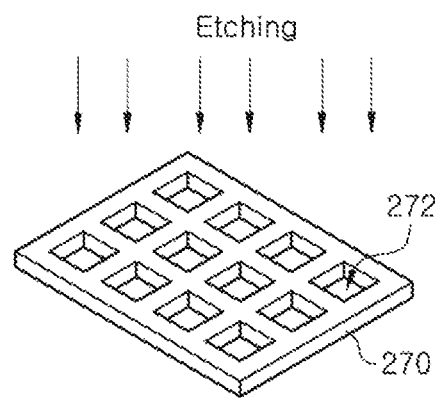
FIGS. 7A and 7B are schematic views illustrating a fabricating process of a cover plate according to an embodiment of the present invention.
Figure 7B:
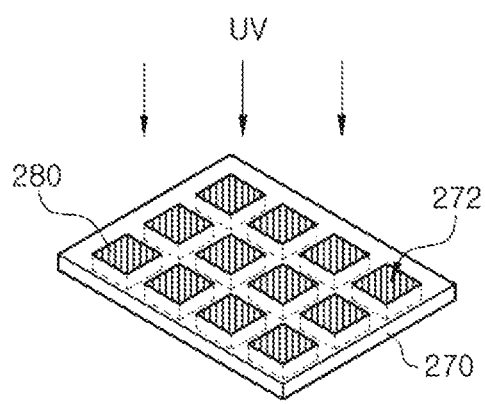

FIGS. 7A and 7B are schematic views illustrating a fabricating process of a cover plate of the present invention.

As shown in FIG. 7A, a base plate is etched to form a plurality of holes 272 such that the high stiffness base 270 including the plurality of holes 272 is provided. Here, an etching mask corresponding to a portion except the holes 272 is used. A depth of the hole 272 is equal to a thickness of the high stiffness base 270.

Next, as shown in FIG. 7B, a low stiffness material is injected into the holes 272, and an UV ray is irradiated to cure the stiffness material. As a result, the low stiffness patterns 280 are formed in the holes 272. Namely, the low stiffness material is an UV curable material. Alternatively, a thermal curing material may be injected, and a thermal curing process may be performed.

By controlling an amount of the low stiffness material or polishing or abrading process after the curing process, the high stiffness base 270 and the low stiffness patterns 280 form a flat surface.

The cover plate 230 is used for at least one of the backplate and the cover window of the foldable display device. Namely, the cover plate 230 is disposed on at least one side of the display panel.

As mentioned above, since the cover plate 230 includes the plurality of low stiffness patterns 280 spaced apart from each other and the high stiffness base 270 surrounding the low stiffness patterns 280, the cover plate 230 and the foldable display device including the cover plate 230 are folded along various directions.

Figure 8:
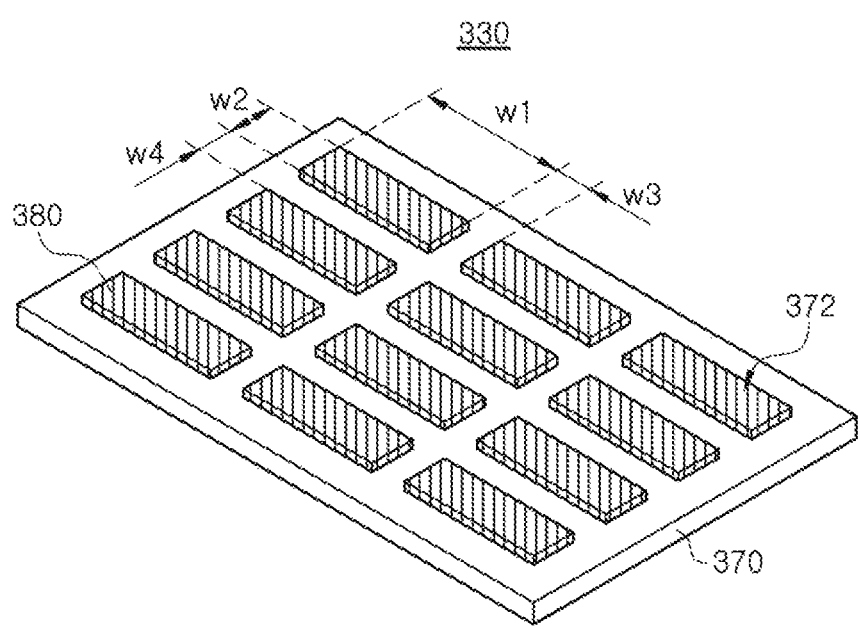
FIG. 8 is a schematic view of a cover plate according to a third embodiment of the present invention.

FIG. 8 is a schematic view of a cover plate according to a third embodiment of the present invention.

As shown in FIG. 8, the cover plate 330 includes a plurality of low stiffness patterns 380 arranged in a high stiffness base 370.

The low stiffness pattern 380 is formed of a material having a stiffness (modulus value or hardness) being smaller than a material of the high stiffness base 370. For example, the high stiffness base 370 may be formed of polymethylmethacrylate (PMMA)-based polymer or silicon-based polymer, and the low stiffness pattern 380 may be formed of polybutylacrylate (PBA)-based polymer or polyvinylidene fluoride (PVDF)-based polymer.

The plurality of low stiffness patterns 380 are arranged to be spaced apart from each other, and the high stiffness base 370 fills a space between low stiffness patterns 380. The low stiffness patterns 280 and the high stiffness base 370 may provide a flat surface.

In other words, the high stiffness base 370 includes a plurality of holes 372, and the low stiffness patterns 380 are positioned in the holes 372.

The low stiffness pattern 380 may have a rectangular shape and have a first width w1 in a major axis direction and a second width w2 in a minor axis direction. A space between adjacent low stiffness patterns 380 may have a third width w3 in the major axis direction and a fourth width w4 in the minor axis direction. Namely, a portion of the high stiffness base 370 between adjacent low stiffness patterns 380 may have the third width w3 in the major axis direction and the fourth width w4 in the minor axis direction.

In this instance, the first width w1 may be equal to or greater than the third width w3, and the second width w2 may equal to or greater than the fourth width w4. To minimize the damages on the high stiffness base 370 by the folding operation, the first width w1 may be greater than the third width w3, and the second width may be greater than the fourth width w4.

For example, the first and second widths w1 and w2 may be about 1.3~2.5 times of the third and fourth widths w3 and w4, respectively.

In addition, in the diagonal direction of the cover plate 330, the width of the low stiffness pattern 380 may be greater than the width of a portion of the high stiffness base 370 between adjacent low stiffness patterns 380.

The plurality of low stiffness patterns 380 are arranged in a lattice shape. In other words, the plurality of holes 372 in the high stiffness base 370 are arranged in the lattice shape.

The cover plate 330 is configured to be folded along various directions.

Namely, as explained with FIG. 5, in the cover plate 330, a folding region may be defined along a first direction D1 or a second direction D2 being perpendicular to the first direction D1. In addition, the folding region may be defined along a third direction D3 crossing the first and second directions D1 and D2 or a fourth direction D4 crossing the first to third directions D1 to D3.

In the cover plate 330 according to the third embodiment of the present invention, since the low stiffness patterns 380 are arranged in the holes 372 of the high stiffness base 370, a high stiffness portion and a low stiffness portion are alternately arranged with each other in all of the first to fourth directions D1 to D4. Accordingly, the foldable display device including the cover plate 330 can be folded along various directions, e.g., the first to fourth directions D1 to D4.

In other words, in the cover plate 330, a first portion having a first stiffness and a second portion having a second stiffness, which is different from the first stiffness, are alternately arranged along the first direction D1 and the second direction D2 being perpendicular to the first direction D1. In addition, along the third direction D3, which crosses the first and second directions D1 and D2, and the fourth direction D4, which crosses the first to third directions D1 to D3, the first portion and the second portion are alternately arranged.

The low stiffness patterns 380 and the high stiffness base 370 provide a flat surface and have substantially the same refractive index. Accordingly, in the foldable display device including the cover plate 330, a problem of viewing a boundary between the low stiffness patterns 380 and the high stiffness base 370 is minimized, and the display quality is improved.

As mentioned above, since the cover plate 330 includes the plurality of low stiffness patterns 380 spaced apart from each other and the high stiffness base 370 surrounding the low stiffness patterns 380, the cover plate 330 and the foldable display device including the cover plate 330 are folded along various directions.

Figure 9:
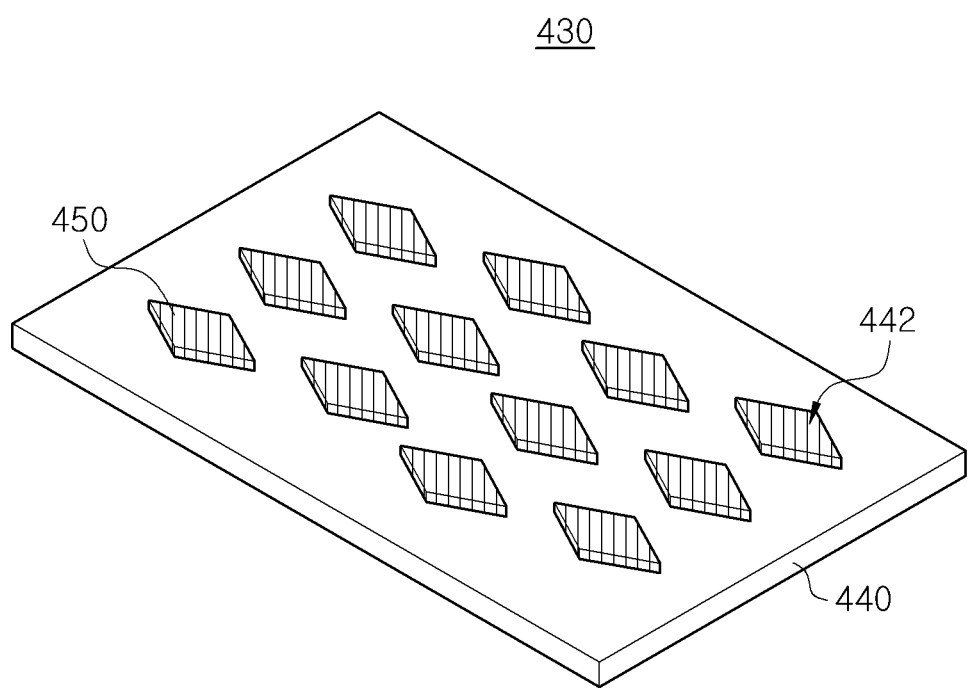
FIG. 9 is a schematic view of a cover plate according to a fourth embodiment of the present invention.

FIG. 9 is a schematic view of a cover plate according to a fourth embodiment of the present invention.

As shown in FIG. 9, the cover plate 430 includes a plurality of low stiffness patterns 450 arranged in a high stiffness base 440.

The low stiffness pattern 450 is formed of a material having a stiffness (modulus value or hardness) being smaller than a material of the high stiffness base 440. For example, the high stiffness base 440 may be formed of polymethylmethacrylate (PMMA)-based polymer or silicon-based polymer, and the low stiffness pattern 450 may be formed of polybutylacrylate (PBA)-based polymer or polyvinylidene fluoride (PVDF)-based polymer.

In other words, the high stiffness base 440 includes a plurality of holes 442, and the low stiffness patterns 380 are positioned in the holes 442.

The low stiffness pattern 450 may have a diamond shape. A width of the low stiffness pattern 450 may be equal to or greater than a distance between adjacent low stiffness patterns 450. For example, along a major axis of the cover plate 430, the width of the low stiffness pattern 450 may be greater than a width of a portion of the high stiffness base 440 between adjacent low stiffness patterns 450.

To minimize the damages on the high stiffness base 440 by the folding operation, the width of the low pattern 450 may be greater than the width of the portion of the high stiffness base 440 between adjacent low stiffness patterns 450. For example, the width of the low pattern 450 may be about 1.3~2.5 times of the width of the portion of the high stiffness base 440 between adjacent low stiffness patterns 450.

In addition, in the diagonal direction of the cover plate 430, the width of the low stiffness pattern 450 may be greater than the width of the portion of the high stiffness base 440 between adjacent low stiffness patterns 450.

The plurality of low stiffness patterns 450 are arranged in a lattice shape. In other words, the plurality of holes 442 in the high stiffness base 440 are arranged in the lattice shape.

The cover plate 430 is configured to be folded along various directions.

Namely, as explained with FIG. 5, in the cover plate 430, a folding region may be defined along a first direction D1 or a second direction D2 being perpendicular to the first direction D1. In addition, the folding region may be defined along a third direction D3 crossing the first and second directions D1 and D2 or a fourth direction D4 crossing the first to third directions D1 to D3.

In the cover plate 430 according to the fourth embodiment of the present invention, since the low stiffness patterns 450 are arranged in the holes 442 of the high stiffness base 440, a high stiffness portion and a low stiffness portion are alternately arranged with each other in all of the first to fourth directions D1 to D4. Accordingly, the foldable display device including the cover plate 430 can be folded along various directions, e.g., the first to fourth directions D1 to D4.

In other words, in the cover plate 430, a first portion having a first stiffness and a second portion having a second stiffness, which is different from the first stiffness, are alternately arranged along the first direction D1 and the second direction D2 being perpendicular to the first direction D1. In addition, along the third direction D3, which crosses the first and second directions D1 and D2, and the fourth direction D4, which crosses the first to third directions D1 to D3, the first portion and the second portion are alternately arranged.

The low stiffness patterns 450 and the high stiffness base 440 provide a flat surface and have substantially the same refractive index. Accordingly, in the foldable display device including the cover plate 430, a problem of viewing a boundary between the low stiffness patterns 450 and the high stiffness base 440 is minimized, and the display quality is improved.

As mentioned above, since the cover plate 430 includes the plurality of low stiffness patterns 450 spaced apart from each other and the high stiffness base 440 surrounding the low stiffness patterns 450, the cover plate 430 and the foldable display device including the cover plate 430 are folded along various directions.

Figure 10:
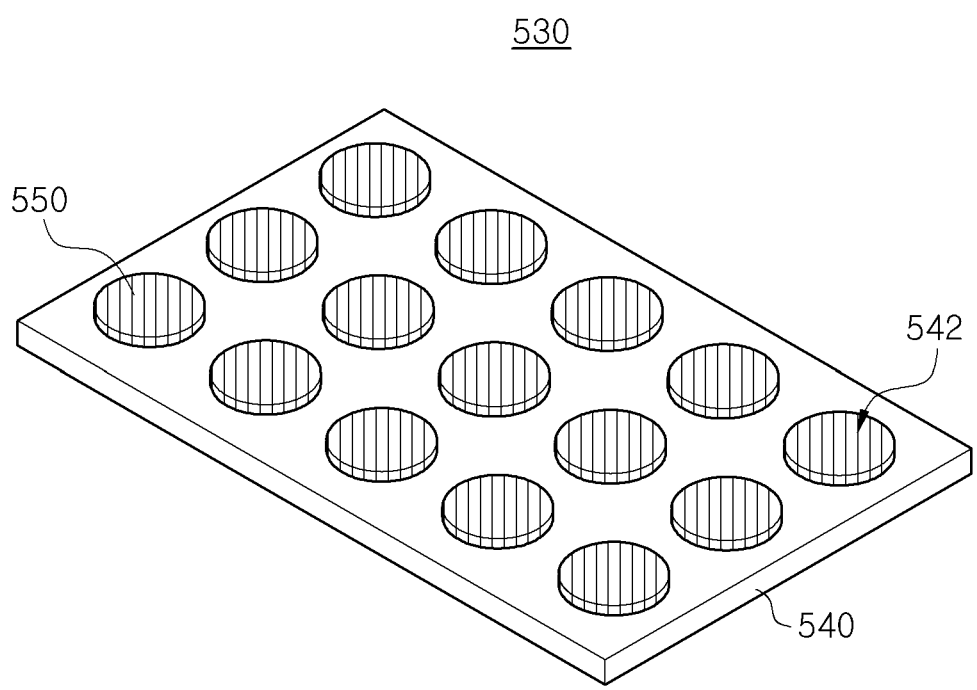
FIG. 10 is a schematic view of a cover plate according to a fifth embodiment of the present invention.

FIG. 10 is a schematic view of a cover plate according to a fifth embodiment of the present invention.

As shown in FIG. 10, the cover plate 530 includes a plurality of low stiffness patterns 550 arranged in a high stiffness base 540.

The low stiffness pattern 550 is formed of a material having a stiffness (modulus value or hardness) being smaller than a material of the high stiffness base 540. For example, the high stiffness base 540 may be formed of polymethylmethacrylate (PMMA)-based polymer or silicon-based polymer, and the low stiffness pattern 550 may be formed of polybutylacrylate (PBA)-based polymer or polyvinylidene fluoride (PVDF)-based polymer.

In other words, the high stiffness base 540 includes a plurality of holes 542, and the low stiffness patterns 550 are positioned in the holes 542.

The low stiffness pattern 550 may have a circle shape. A width (diameter) of the low stiffness pattern 550 may be equal to or greater than a distance between adjacent low stiffness patterns 550. For example, along a major axis of the cover plate 530, the width of the low stiffness pattern 550 may be greater than a width of a portion of the high stiffness base 540 between adjacent low stiffness patterns 550.

To minimize the damages on the high stiffness base 540 by the folding operation, the width of the low pattern 550 may be greater than the width of the portion of the high stiffness base 540 between adjacent low stiffness patterns 550. For example, the width of the low pattern 550 may be about 1.3~2.5 times of the width of the portion of the high stiffness base 540 between adjacent low stiffness patterns 550.

In addition, in the diagonal direction of the cover plate 530, the width of the low stiffness pattern 550 may be greater than the width of the portion of the high stiffness base 540 between adjacent low stiffness patterns 550.

The plurality of low stiffness patterns 550 are arranged in a lattice shape. In other words, the plurality of holes 542 in the high stiffness base 540 are arranged in the lattice shape.

The cover plate 530 is configured to be folded along various directions.

Namely, as explained with FIG. 5, in the cover plate 530, a folding region may be defined along a first direction D1 or a second direction D2 being perpendicular to the first direction D1. In addition, the folding region may be defined along a third direction D3 crossing the first and second directions D1 and D2 or a fourth direction D4 crossing the first to third directions D1 to D3.

In the cover plate 530 according to the fifth embodiment of the present invention, since the low stiffness patterns 550 are arranged in the holes 542 of the high stiffness base 540, a high stiffness portion and a low stiffness portion are alternately arranged with each other in all of the first to fourth directions D1 to D4. Accordingly, the foldable display device including the cover plate 530 can be folded along various directions, e.g., the first to fourth directions D1 to D4.

In other words, in the cover plate 530, a first portion having a first stiffness and a second portion having a second stiffness, which is different from the first stiffness, are alternately arranged along the first direction D1 and the second direction D2 being perpendicular to the first direction D1. In addition, along the third direction D3, which crosses the first and second directions D1 and D2, and the fourth direction D4, which crosses the first to third directions D1 to D3, the first portion and the second portion are alternately arranged.

The low stiffness patterns 550 and the high stiffness base 540 provide a flat surface and have substantially the same refractive index. Accordingly, in the foldable display device including the cover plate 530, a problem of viewing a boundary between the low stiffness patterns 550 and the high stiffness base 540 is minimized, and the display quality is improved.

As mentioned above, since the cover plate 530 includes the plurality of low stiffness patterns 550 spaced apart from each other and the high stiffness base 540 surrounding the low stiffness patterns 550, the cover plate 530 and the foldable display device including the cover plate 530 are folded along various directions.

Figure 11:
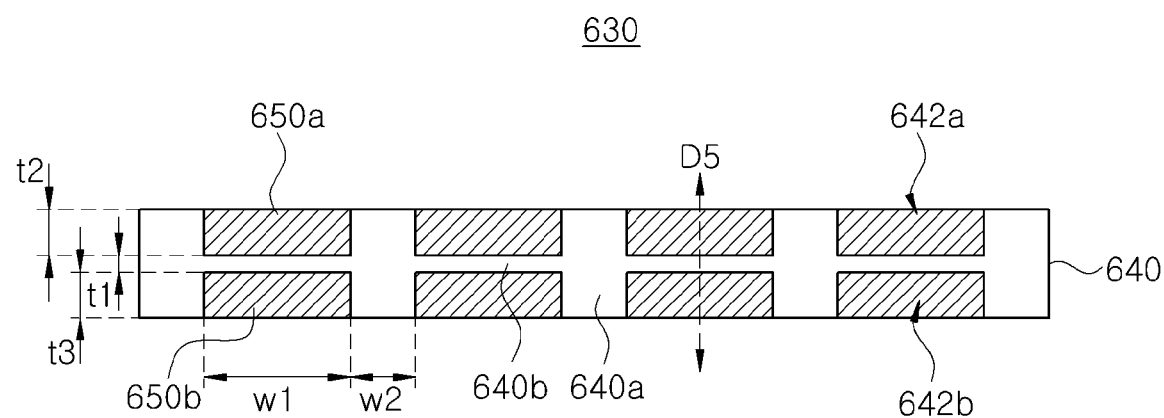
FIG. 11 is a schematic view of a cover plate according to a sixth embodiment of the present invention.

FIG. 11 is a schematic view of a cover plate according to a sixth embodiment of the present invention.

As shown in FIG. 11, the cover plate 630 includes a plurality of low stiffness patterns 650 arranged in a high stiffness base 640. The low stiffness patterns 650 include a plurality of upper patterns (first low stiffness pattern) 650a, which are arranged in a plane to be spaced apart from each other, and a plurality of lower patterns (second low stiffness pattern) 650b corresponding to the upper patterns 650a. Namely, the lower pattern 650b overlaps the upper pattern 650a.

The upper and lower patterns 650a and 650b are formed of a material having a stiffness (modulus value or hardness) being smaller than a material of the high stiffness base 640. For example, the upper and lower patterns 650a and 650b of the low stiffness pattern 650 may be formed of polymethylmethacrylate (PMMA)-based polymer or silicon-based polymer, and the low stiffness pattern 550 may be formed of polybutylacrylate (PBA)-based polymer or polyvinylidene fluoride (PVDF)-based polymer.

The upper and lower patterns 650a and 650b are arranged in a vertical direction and a horizontal direction to be spaced apart from each other, and the high stiffness base 640 fills a space between upper and lower patterns 650a and 650b. The upper and lower patterns 650a and 650b and the high stiffness base 640 may provide a flat surface.

The upper and lower patterns 650a and 650b are arranged in a lattice shape.

Namely, a plurality of upper indentations (or concaves) 642a and a plurality of lower indentations 642b are formed in the high stiffness base 640, and the upper and lower patterns 650a and 650b are positioned in the upper and lower indentations 642a and 642b. The upper and lower patterns 650a and 650b are spaced part from each other along a thickness direction of the cover window 630. Namely, the high stiffness base 640 further includes a vertical portion 640a (a first region) between adjacent upper patterns 650a and between adjacent lower patterns 650b and a horizontal portion 640b (a second region) between the upper pattern 650a and the lower pattern 650b. In other words, the upper pattern 650a and the lower pattern 650b overlap with the horizontal portion 640b therebetween.

In the horizontal direction, each of the upper and lower patterns 650a and 650b has a first width w1, and a portion of the high stiffness base 640 between adjacent upper patterns 650a or between adjacent lower patterns 650b has a second width w2. Namely, the vertical portion 640a of the high stiffness base 640 has the second width w2. In this instance, the first width w1 is equal to or greater than the second width w2. To minimize the damages on the high stiffness base 640 by the folding operation, the first with w1 may be greater than the second width w2. For example, the first width w1 may be about 1.3~2.5 times of the second width w2.

In addition, in the diagonal direction of the cover plate 630, the width of each of the upper and lower patterns 650a and 650b may be greater than the width of the vertical portion 640a the high stiffness base 640.

The horizontal portion 640b of the high stiffness base 640 between the upper pattern 650a and the lower pattern 650b has a first thickness t1, and the upper and lower patterns 650a and 650b respectively have a second thickness t2 and a third thickness t3 being greater than the first thickness t1.

In the cover plate 630, since the horizontal portion 640b of the high stiffness base 640 is disposed between the upper and lower patterns 650a and 650b, an adhesion strength of the upper and lower patterns 650a and 650b to the high stiffness base 640 is increased.

For example, referring to FIG. 6, in the cover plate 230, the side surfaces of the low stiffness pattern 280 except the upper surface and/or the lower surface contact the high stiffness base 270 such that an adhesion area between the low stiffness pattern 280 and the high stiffness base 270 is relatively small. However, in the cover plate 630, the side surfaces of the upper and lower patterns 650a and 650b contact the vertical portion 640a of the high stiffness base 640, and the lower surface of the upper pattern 650a and the upper surface of the lower pattern 650b contact the horizontal portion 640b of the high stiffness base 640.

Accordingly, in the cover plate 630, the adhesion strength (or property) of the upper and lower patterns 650a and 650b to the high stiffness base 640 is increased.

The cover plate 630 is configured to be folded along various directions.

Namely, as explained with FIG. 5, in the cover plate 630, a folding region may be defined along a first direction D1 or a second direction D2 being perpendicular to the first direction D1. In addition, the folding region may be defined along a third direction D3 crossing the first and second directions D1 and D2 or a fourth direction D4 crossing the first to third directions D1 to D3.

In the cover plate 630 according to the sixth embodiment of the present invention, since the low stiffness patterns 650a and 650b are arranged in the indentations 642a and 642b of the high stiffness base 640, a high stiffness portion and a low stiffness portion are alternately arranged with each other in all of the first to fourth directions D1 to D4. Accordingly, the foldable display device including the cover plate 630 can be folded along various directions, e.g., the first to fourth directions D1 to D4.

In other words, in the cover plate 630, a first portion having a first stiffness and a second portion having a second stiffness, which is different from the first stiffness, are alternately arranged along the first direction D1 and the second direction D2 being perpendicular to the first direction D1. In addition, along the third direction D3, which crosses the first and second directions D1 and D2, and the fourth direction D4, which crosses the first to third directions D1 to D3, the first portion and the second portion are alternately arranged.

In addition, along a direction being perpendicular to the first to fourth directions D1 to D4, i.e., a vertical direction D5 to the cover plate 630, the first portion of the first stiffness and the second portion of the second stiffness are alternately arranged.

The upper and lower patterns 650a and 650b and the high stiffness base 640 provide a flat surface and have substantially the same refractive index. Accordingly, in the foldable display device including the cover plate 630, a problem of viewing a boundary between the upper and lower patterns 650a and 650b and the high stiffness base 640 is minimized, and the display quality is improved.

When the cover plate 630 is disposed on the display panel 110 such that the lower pattern 650b faces the display panel 110 (e.g., of FIG. 2), the upper pattern 650a may have a stiffness (modulus value or hardness) being smaller than the high stiffness base 640 and greater than the lower pattern 650b.

Namely, the stiffness of the upper pattern 650a may be greater than that of the lower pattern 650b to minimize damages from the outer impact, and the stiffness of the lower pattern 650b may be smaller than that of the upper pattern 650a to improve the folding operation property.

As mentioned above, since the cover plate 630 includes the plurality of upper and lower patterns 650a and 650b spaced apart from each other and the high stiffness base 640 surrounding the upper and lower patterns 650a and 650b, the cover plate 630 and the foldable display device including the cover plate 630 are folded along various directions.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A cover plate, comprising:
a high stiffness base including a plurality of upper indentations at a first surface and a plurality of lower indentations corresponding to the plurality of upper indentations at a second surface;
a plurality of first low stiffness patterns in the upper indentations and providing a flat surface with the first surface; and
a plurality of second low stiffness patterns in the lower indentations,
wherein a pair of one of the plurality of first low stiffness patterns and one of the plurality of second low stiffness patterns directly overlap with each other, and
wherein the high stiffness base includes a high stiffness vertical portion extending between adjacent first low stiffness patterns and adjacent second low stiffness patterns, and a high stiffness horizontal portion extending between the pair of the one of the plurality of first low stiffness patterns and the one of the plurality of second low stiffness patterns.

2. The cover plate according to claim 1, wherein a width of each upper indentation is greater than a distance between adjacent upper indentations, and a width of each lower indentation is greater than a distance between adjacent lower indentations.

3. The cover plate according to claim 1, wherein the high stiffness base includes a vertical portion between adjacent upper indentations and between adjacent lower indentations and a horizontal portion between the upper indentation and the lower indentation.

4. The cover plate according to claim 1, wherein the plurality of upper indentations and the plurality of lower indentations are respectively arranged in a lattice shape.

5. The cover plate according to claim 1, wherein a refractive index of each of the plurality of first and second low stiffness patterns is substantially same as a refractive index of the high stiffness base.

6. A foldable display device, comprising:
a cover plate including:
a plurality of low stiffness patterns being spaced apart from each other in a first direction and a second direction being substantially perpendicular to the first direction, and
a high stiffness base filling a space between the plurality of low stiffness patterns in the first direction and the second direction and providing a flat surface with the plurality of low stiffness patterns; and
a display panel at a side of the cover plate,
wherein all of the plurality of low stiffness patterns have a same shape, wherein a refractive index of each of the plurality of low stiffness patterns is substantially same as a refractive index of the high stiffness base, wherein each of the plurality of low stiffness patterns includes an upper pattern and a lower pattern, and wherein the high stiffness base includes a vertical portion between adjacent upper patterns and between adjacent lower patterns and a horizontal portion between the upper pattern and the lower pattern.

7. The foldable display device according to claim 6, wherein the foldable display device is configured to be folded along at least one of a first direction, a second direction being substantially perpendicular to the first direction and a third direction crossing the first and second directions.

8. A foldable display device, comprising:
a cover plate including:
a high stiffness base including a plurality of upper indentations at a first surface and a plurality of lower indentations corresponding to the plurality of upper indentations at a second surface,
a plurality of first low stiffness patterns in the upper indentations and providing a flat surface with the first surface, and
a plurality of second low stiffness patterns in the lower indentations; and
a display panel at a side of the cover plate,
wherein each of the plurality of first low stiffness patterns overlaps with a corresponding second low stiffness pattern among the plurality of second low stiffness patterns, and
wherein the high stiffness base includes a high stiffness vertical portion extending between adjacent first low stiffness patterns and adjacent second low stiffness patterns, and a high stiffness horizontal portion extending between the plurality of first low stiffness patterns and plurality of second low stiffness patterns.

9. The foldable display device according to claim 8, wherein the foldable display device is configured to be folded along at least one of a first direction, a second direction being substantially perpendicular to the first direction and a third direction crossing the first and second directions.

* * * * *